(12) United States Patent
Ng et al.

(10) Patent No.: US 8,860,079 B2
(45) Date of Patent: Oct. 14, 2014

(54) SEMICONDUCTOR PACKAGES AND METHODS OF PACKAGING SEMICONDUCTOR DEVICES

(75) Inventors: Catherine Bee Liang Ng, Singapore (SG); Kriangsak Sae Le, Johor (MY); Chuen Khiang Wang, Singapore (SG); Nathapong Suthiwongsunthorn, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 0 days.

(21) Appl. No.: 13/467,050

(22) Filed: May 9, 2012

(65) Prior Publication Data

US 2012/0220082 A1    Aug. 30, 2012

Related U.S. Application Data

(63) Continuation-in-part of application No. 13/295,097, filed on Nov. 14, 2011.

(60) Provisional application No. 61/413,577, filed on Nov. 15, 2010.

(51) Int. Cl.
| | | |
|---|---|---|
| H01L 21/56 | (2006.01) | |
| H01L 23/48 | (2006.01) | |
| H01L 25/065 | (2006.01) | |
| H01L 23/538 | (2006.01) | |
| H01L 23/31 | (2006.01) | |
| H01L 23/00 | (2006.01) | |

(52) U.S. Cl.
CPC ... *H01L 23/3128* (2013.01); H01L 2224/32225 (2013.01); H01L 2224/73253 (2013.01); *H01L 24/32* (2013.01); *H01L 25/0657* (2013.01); *H01L 23/5389* (2013.01); H01L 2224/73267 (2013.01); *H01L 24/20* (2013.01); H01L 24/05 (2013.01); H01L 2225/06593 (2013.01); *H01L 21/561* (2013.01); H01L 2224/32145 (2013.01); H01L 2224/92244 (2013.01); H01L 2224/12105 (2013.01); H01L 2924/01033 (2013.01); H01L 2225/06565 (2013.01); H01L 2224/04105 (2013.01); *H01L 21/568* (2013.01); H01L 2224/32245 (2013.01); H01L 2224/20 (2013.01); H01L 2924/01005 (2013.01); H01L 2225/06517 (2013.01); H01L 2924/10253 (2013.01); H01L 2225/06541 (2013.01);

(Continued)

(58) Field of Classification Search
USPC .................................. 257/E21.499, 700, 686
See application file for complete search history.

(56) References Cited

U.S. PATENT DOCUMENTS

| | | |
|---|---|---|
| 7,425,464 B2 | 9/2008 | Fay et al. |
| 7,727,818 B2 | 6/2010 | Hsieh et al. |

(Continued)

FOREIGN PATENT DOCUMENTS

| | | |
|---|---|---|
| KR | 20010094035 | 10/2001 |
| KR | 20090071365 | 7/2009 |
| KR | 20100069007 | 6/2010 |

*Primary Examiner* — Mamadou Diallo
(74) *Attorney, Agent, or Firm* — Horizon IP Pte. Ltd.

(57) ABSTRACT

Semiconductor packages and methods of forming a semiconductor package are disclosed. The method includes providing at least one die having first and second surfaces. The second surface of the die includes a plurality of conductive pads. A permanent carrier is provided and the at least one die is attached to the permanent carrier. The first surface of the at least one die is facing the permanent carrier. A cap having first and second surfaces is formed to encapsulate the at least one die. The first surface of the cap contacts the permanent carrier and the second surface of the cap is disposed at a different plane than the second surface of the die.

20 Claims, 6 Drawing Sheets

(52) U.S. Cl.
CPC ...... *H01L 24/19* (2013.01); *H01L 2924/01013* (2013.01); *H01L 2924/18162* (2013.01); *H01L 24/83* (2013.01); *H01L 2924/01029* (2013.01); *H01L 2924/01006* (2013.01); *H01L 2225/06513* (2013.01); *H01L 2924/01082* (2013.01); *H01L 2225/06589* (2013.01); *H01L 24/73* (2013.01); *H01L 2224/05647* (2013.01); *H01L 24/16* (2013.01); *H01L 2224/0401* (2013.01); *H01L 2224/48145* (2013.01); *H01L 2224/16145* (2013.01); *H01L 2224/0557* (2013.01); *H01L 2924/014* (2013.01); *H01L 2924/3511* (2013.01); *H01L 2224/73259* (2013.01); *H01L 2924/14* (2013.01); *H01L 2224/94* (2013.01); *H01L 2224/83192* (2013.01); *H01L 2924/01079* (2013.01); *H01L 24/48* (2013.01)
USPC ........... 257/124; 438/122; 438/126; 257/660; 257/E21.502; 257/E21.506; 257/E23.114

(56) References Cited

U.S. PATENT DOCUMENTS

| | | | |
|---|---|---|---|
| 7,872,347 | B2 | 1/2011 | Kaufmann |
| 2006/0073638 | A1 | 4/2006 | Hsu |
| 2009/0072382 | A1 | 3/2009 | Guzek |
| 2009/0160053 | A1 | 6/2009 | Meyer et al. |
| 2009/0309212 | A1 | 12/2009 | Shim et al. |
| 2010/0072597 | A1 | 3/2010 | Chow et al. |
| 2011/0068484 | A1 | 3/2011 | Meyer et al. |
| 2011/0079923 | A1 | 4/2011 | Suh |
| 2011/0140247 | A1* | 6/2011 | Pagaila et al. ............ 257/659 |
| 2011/0215450 | A1* | 9/2011 | Chi et al. ............ 257/660 |
| 2011/0291283 | A1 | 12/2011 | Chi et al. |
| 2011/0298137 | A1* | 12/2011 | Pagaila et al. ............ 257/773 |
| 2012/0056321 | A1* | 3/2012 | Pagaila ............ 257/737 |
| 2012/0140929 | A1 | 6/2012 | Clark et al. |

* cited by examiner

SEMICONDUCTOR PACKAGES AND METHODS OF PACKAGING SEMICONDUCTOR DEVICES

CROSS-REFERENCE TO RELATED APPLICATION

This is a continuation-in-part application of co-pending U.S. patent application Ser. No. 13/295,097, filed on Nov. 14, 2011 which claims the priority of U.S. Provisional Application No. 61/413,577 entitled "Embedded Die Fan-Out Packaging Structures and Processes" filed on Nov. 15, 2010, which are herein incorporated by reference in their entireties.

BACKGROUND

Industry fan-out solutions involve high capital investment costs for new wafer redistribution layer (RDL) and bumping facilities. Furthermore, new equipment for compression molding system and retrofit kits are required to enable wafer handling in the pick and place system for fan-out solutions.

To minimize or avoid the above mentioned expenses, it is desirable to improve fan-out semiconductor packaging processes which are able to utilize existing equipment tools and process associated with current wafer level fan out solutions. Additionally, it is desirable to produce fan-out semiconductor packages having very thin package profile, higher I/O counts for wafer level chip scale packaging, with multi-level redistribution layers and possibly system in package applications. Moreover, it is also desirable to produce semiconductor packages with enhanced heat dissipation capability.

SUMMARY

Embodiments relate generally to semiconductor packages. In one embodiment, a method for forming a semiconductor package is presented. The method includes providing at least one die having first and second surfaces. The second surface of the die includes a plurality of conductive pads. The method also includes providing a permanent carrier and attaching the at least one die to the permanent carrier. The first surface of the at least one die is facing the permanent carrier. A cap having first and second surfaces is formed to encapsulate the at least one die. The first surface of the cap contacts the permanent carrier and the second surface of the cap is disposed at a different plane than the second surface of the die.

In another embodiment, a method for forming a semiconductor package is disclosed. The method includes providing at least one die stack having first and second surfaces. The second surface of the die stack includes a plurality of conductive pads. A permanent carrier is provided and the at least one die stack is attached to the permanent carrier. The first surface of the at least one die stack is facing the permanent carrier. A cap having first and second surfaces is formed to encapsulate the at least one die stack. The first surface of the cap contacts the permanent carrier and the second surface of the cap is disposed at a different plane than the second surface of the die stack.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION

Embodiments relate to semiconductor packages and methods for forming a semiconductor package. The packages are used to package one or more semiconductor dies or chips. For the case of more than one die, the dies may be arranged in a planar arrangement, vertical arrangement, or a combination thereof. The dies, for example, may include memory devices, logic devices, communication devices, optoelectronic devices, digital signal processors (DSPs), microcontrollers, system-on-chips (SOCs) as well as other types of devices or a combination thereof. Such packages may be incorporated into electronic products or equipment, such as phones, computers as well as mobile and mobile smart products. Incorporating the packages into other types of products may also be useful.

Figure 1:
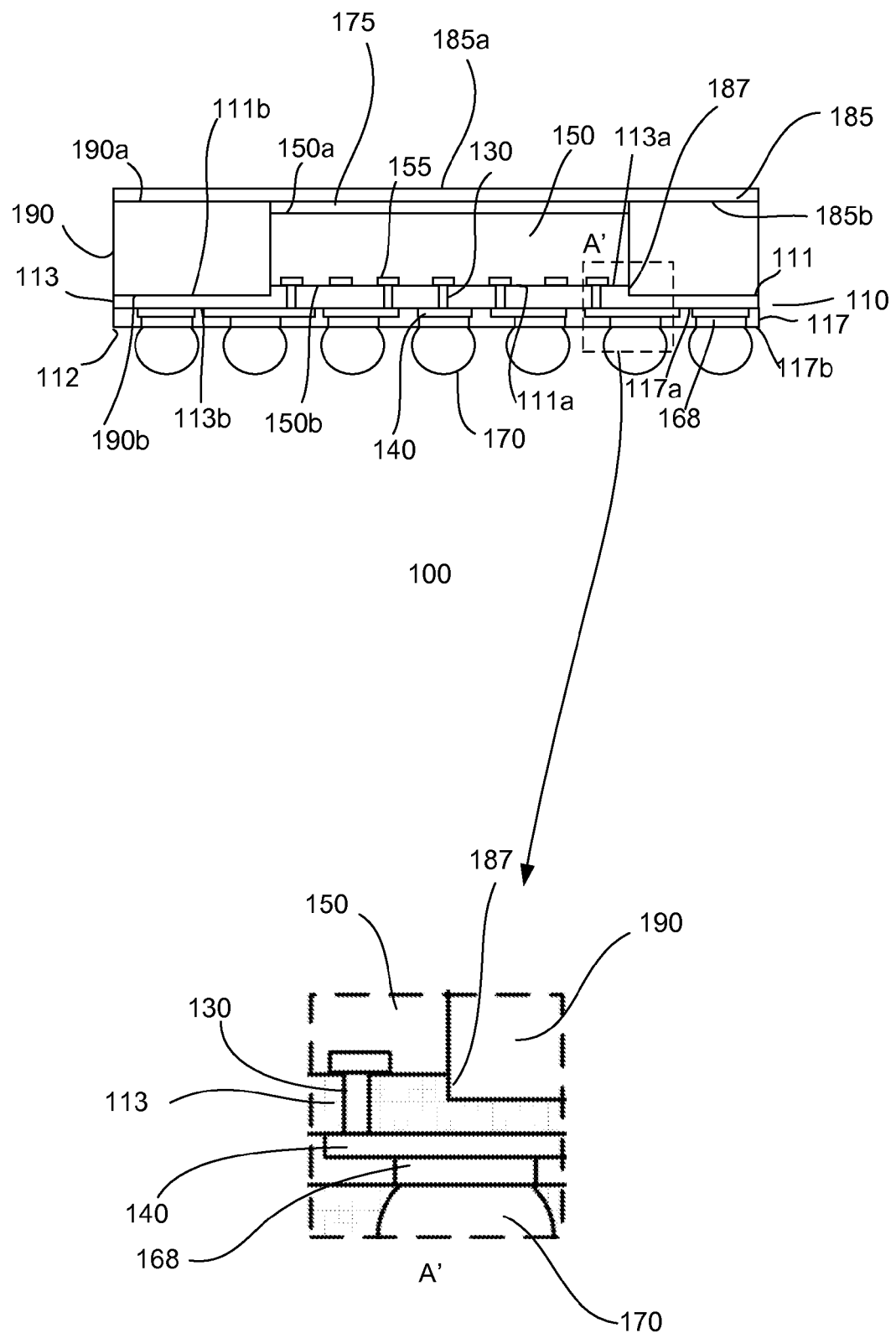
FIGS. 1 and 2 show various embodiments of a semiconductor package.

FIG. 1 shows simplified cross-sectional view of an embodiment of a semiconductor package 100 with a portion A' in greater detail. The package includes a built-up or integrated wiring substrate 110. The wiring substrate includes first and second major surfaces 111 and 112. The first major surface, for example, may be referred to as the top surface and the second major surface, for example, may be referred to as the bottom surface. Other designations for the surfaces may also be useful. In one embodiment, the first major surface of the wiring substrate includes first and second regions 111a-b. The first region, for example, is a die or chip region on which a die 150 is mounted and the second region, for example, is a non-die region. In one embodiment, the non-die region surrounds the die region. The die region, for example, may be disposed in a central portion of which the die 150 is mounted and a non-die region 111b which is outside of the die attach region. The die region, for example, may be concentrically disposed within the periphery of the wiring substrate. Other configurations of die and non-die region may also be useful.

The die can be a semiconductor die or chip. The die, for example, may be any type of integrated circuit (IC), such as a memory device such as a dynamic random access memory (DRAM), a static random access memory (SRAM) and various types of non-volatile memories including programmable read-only memories (PROM) and flash memories, an optoelectronic device, a logic device, a communication device, a digital signal processor (DSP), a microcontroller, a system-on-chip, as well as other types of devices.

The die includes a first surface 150a and a second major surface 150b. The first surface, for example, is an inactive or backside of the die and the second surface is an active surface of the die. Other designations for the surfaces of the die may also be useful. The active surface of the die contacts the die region of the wiring substrate. The active surface, for example, includes openings in a final passivation layer (not shown) to expose conductive die pads 155. The surfaces of the conductive die pads, for example, are substantially coplanar with the second major surface 150b of the die. Providing surfaces of the conductive pads which are not coplanar with the second major surface of the die may also be useful. The die pads provide connections to the circuitry of the die. The die pads, for example, are formed of a conductive material, such as copper, aluminum, gold, nickel or alloys thereof. Other types of conductive material may also be used for the die pads. The pattern of the die pads may be one or more rows disposed at a center or at opposing sides of the active surface. Other pad patterns, such as grid or matrix arrangements, may also be useful.

In one embodiment, the wiring substrate includes a multi-layered substrate. The multi-layered substrate, in one embodiment, includes first and second insulating substrate layers 113 and 117. The first layer includes first 113a and second surfaces 113b. The first surface may be referred to as the top surface and the second surface may be referred to as the bottom surface. Other designations for the surfaces of the first layer may also be useful. The first surface contacts the die. In one embodiment, the first layer includes through via contacts 130 which extend from the first surface to the second surface of the first layer. The via contacts are formed of a conductive material. For example, the via contacts may be formed of copper, aluminum, gold, nickel or alloys thereof. Other types of conductive materials may also be useful. The via contacts are isolated from each other by the first insulating substrate layer.

Conductive traces 140 are disposed on the second surface of the first insulating substrate layer. The conductive traces are formed of a conductive material, such as copper, aluminum, gold, nickel or alloys thereof. Other types of conductive material may also be useful. The conductive traces are coupled to the substrate via contacts forming interconnects which are coupled to the die pads of the same die. The conductive traces may include conductive pads 168.

The first substrate layer may be a dielectric layer. The dielectric layer, for example, is disposed on the second surface of the die. Other types of first substrate layer may also be useful. In other embodiments, the substrate layer may be patterned to provide vias in which substrate via contacts are disposed. Formation of the vias in the first substrate layer may be achieved by any suitable techniques, including and not limited to laser and mechanical drilling.

The second insulating substrate layer includes first 117a and second surfaces 117b. The first surface may be referred to as the top surface and the second surface may be referred to as the bottom surface. Other designations for the surfaces of the second insulating substrate layer may also be useful. The first surface of the second insulating layer is disposed on the second surface of the first substrate layer and the conductive traces; the second surface serves as a bottom surface of the package. The second substrate layer isolates the conductive traces from each other. The second substrate layer may be formed of solder mask or other dielectric materials. Other types of second substrate layers may also be useful.

Openings are provided in the second substrate layer in which package contacts 170 are disposed. The openings, for example, expose conductive pads on the conductive traces. The pattern of the openings may be designed to provide the desired package contact pattern. For example, the contact openings may be arranged in a grid pattern to form a BGA type package. Other contact opening patterns may also be useful. The conductive pads, for example, are coplanar with the conductive traces. In other embodiments, the conductive pads may include protruding conductive pads. The conductive pads may be further covered with a surface protection material, such as OSP or a metallic coating or plating.

The external package contacts 170 are disposed on the second substrate layer in the openings. The package contacts, for example, are spherical shaped structures or balls. The package contacts protrude from the bottom surface of the second substrate layer. Providing package contacts which do not protrude from the bottom surface of the second substrate layer, such as solder lands, may also be useful. The package contact is formed of a conductive material. The package contacts, in one embodiment, can be formed from solder. Various types of solder can be used to form the package contacts. For example, the solder can be a lead-based or non lead-based solder. Other types of conductive materials may also be used to form the package contacts.

In other embodiments, the package contacts may include other types of package contacts such as copper pillars or gold stud bumps (not shown). The use of copper pillars is advantageous as they do not collapse after reflow. Hence, copper pillars enable semiconductor package with much tighter pitch and more uniform standoff height to be produced. Gold stud bumps, on the other hand, may sometimes be used in conjunction with anisotropic conductive adhesive and thermo-compression welding methods to achieve tight pitches. This is advantageous as it allows IC chips that were originally designed with peripheral bond pads intended for wire bonding to be used as flip chips. Other suitable types of package contacts may also be useful.

The package contacts provide external access to the die via the conductive traces, substrate via contacts and die pads. The package may be electrically coupled to an external device (not shown), such as a circuit board, by the package contacts.

In one embodiment, the built-up wiring substrate is an integrated package substrate. As described, the package substrate directly contacts the die in the die region, with the conductive traces and via contacts coupled to the die pads of the same die. In one embodiment, the integrated package substrate includes via contacts which are directly coupled to the die pads of the same die. The wiring substrate serves as a fan out redistribution structure for the die, enabling redistributed, fanned-out external package connections.

As described, the first substrate layer is a single layer. In other embodiments, the first substrate layer 113 may include a plurality of first sub-layers. For example, the first substrate layer may include first and second first sub-layers. Providing a first substrate layer with other numbers of first sub-layers may also be useful. The first and second first sub-layers, for example, may include the same material. Providing the first sub-layer having a different material than the second sub-layer may also be useful. A first sub-layer is similar to the first substrate layer. For example, a first sub-layer includes first and second surfaces and substrate via contacts extending through the surfaces and conductive traces on the second surface. The first surface of a sub-layer either contacts the die or the second surface of an adjacent first sub-layer. This produces a first substrate layer or layered stack with multiple conductive layers. Providing a first substrate layer having multiple built-up conductive layers may facilitate a package for a die with a higher density of the die contacts and package contacts.

In one embodiment, a cap 190 is formed over the second region 111b of the first major surface 111 of the package substrate. The cap serves to protect the die from the environment. For example, the cap may protect the die from moisture. The cap, for example, is formed of an encapsulation material. The encapsulation material, for example, may be molding epoxy resin material. Other types of encapsulation materials may also be useful The cap includes first and second major surfaces 190a-b. The first surface, for example, may be the top surface and the second surface may be the bottom surface. Other designations for the surfaces of the cap may also be useful. In one embodiment, the cap at least surrounds the die. For example, the bottom surface 190*b* is disposed on the package substrate on the non-die region of the package substrate. The cap, by surrounding the die, protects the die.

In one embodiment, the non-die region is disposed in a different plane than the die region. For example, as shown by portion A', the die and non-die region forms a step 187 in the package substrate. In one embodiment, the die region is disposed or recessed into the encapsulation material with respect to first major surface 190*a* of the cap. For example, the die region 111*a* has a greater distance from the bottom 117*b* of the package substrate than the non-die region 111*b*. The non-die region, for example, is above the die region or the conductive die pads with respect to the first major surface 190*a* of the cap. Referring to FIG. 1, the second surface of the die is disposed in a different plane than the second surface of the cap. Providing the bottom surface of the cap at a different plane than the die advantageously relieves the mechanical stress on the die due to the thermal mismatch of the package materials.

In one embodiment, the cap does not cover the backside or first surface of the die, as shown in FIG. 1. For example, the top surface 190*a* of the cap is about co-planar with the backside surface 150*a* of the die. Alternatively, the top surface of the cap need not be co-planar with the backside surface of the die. For example, the first surface 190*a* of the cap is above the backside surface 150*a* of the die, depending on the thickness of the adhesive layer which is disposed over the backside surface of the die as will be described later.

In one embodiment, a carrier 185 is permanently disposed on top of the top or first surfaces of the cap 190*a* and the die 150*a*. For example, the carrier remains as part of the packaged die. The carrier includes a first and a second major surface. The first major surface 185*a*, for example, is a top surface and the second major surface 185*b* is a bottom surface of the carrier. Other designations for the surfaces of the carrier may also be useful. In one embodiment, the second surface of the carrier at least contacts the first surface of the cap while the first surface of the carrier is exposed. The second surface of the carrier, for example, covers substantially the whole first surfaces of the die and the cap.

In one embodiment, an adhesive 175 is provided on the second surface of the carrier. The adhesive, for example, bonds at least the carrier and the die. In one embodiment, the adhesive is provided at least in between the second surface of the carrier and the first surface of the die. In other embodiments, the adhesive may also be provided in between the second surface of the carrier and the first surfaces of the cap and die. The adhesive, for example, includes a film, paste, liquid or thermally conductive adhesive. Other suitable types of adhesive that facilitates bonding at least between the carrier and the die may also be used. The adhesive may include any suitable thickness so long as it could at least permanently bonds the dies and the carrier during processing.

As shown in FIG. 1, the carrier covers substantially the whole first surfaces of the die and the cap. The carrier, in one embodiment, should be sufficiently rigid to serve as a permanent carrier or permanent support for holding the die or die stack during assembly, as will be described in detail later. Alternatively or in addition, the carrier, for example, may also serve as a thermal conductor for dissipating heat from the die or die stack of the semiconductor package. By way of a non-limiting example, the carrier may include a wafer or a conductive plate. For example, the wafer may include a silicon wafer and the conductive plate may include a metal plate. Other suitable types of materials may also be used to form the carrier. The semiconductor package may also include additional heat sink or heat spreader to enhance heat dissipation. For example, a heat spreader (not shown) may be attached over the carrier to further improve heat dissipation.

Figure 2:
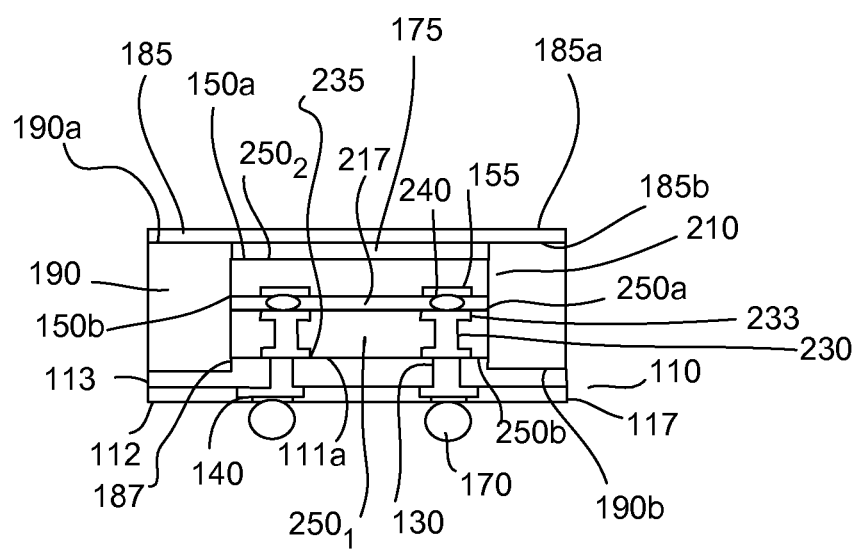

FIG. 2 shows another embodiment of a semiconductor package 200. The semiconductor package is similar to that described in FIG. 1. As such, common elements may not be described or described in detail.

The semiconductor package 200 includes a die stack 210 being mounted on a die region 111*a* of a wiring substrate 110. The die stack includes n number of dies, where n is ≥2. The bottom die, for example, may be referred to as the first (e.g., n=1) and the top die is equal to n. Designating the dies of the die stacks using other conventions may also be useful. The die stack, for example, may be formed by any suitable types of die stacking methods. As shown, the die stack includes first and second dies $250_1$ and $250_2$. The second die $250_2$ is attached onto the first die $250_1$, and the first die is attached to the die region 111*a* of the wiring substrate 110. Dies used for the die stack may be TSV or non-TSV dies. In one embodiment, both top and bottom dies may be TSV dies. In yet another embodiment, the bottom die may include a TSV die and the top die may include a non-TSV die. Non-TSV die, for example, may include wire bonded, direct connection, flip chip die, etc. For die stacks having more than 2 dies, the lower dies (bottom and intermediate dies except the top die) are usually TSV dies while the top die is a non-TSV die. Other configurations or types of dies of a die stack may also be useful.

A TSV die includes first and second major surfaces 250*a-b*. The first surface includes first die contacts 233 and the second major surface includes second die contacts 235. The die contacts, for example, are die contact pads which have top surfaces co-planar with the first 250*a* and second 250*b* major surfaces of the die. Providing surfaces of the contact pads which are not coplanar with the surfaces of the die may also be useful. Other configurations of die contacts or die contact pads may also be useful. The first and second die contacts are interconnected by through via contacts 230. Other configurations of the TSV dies may also be useful. The via contacts and the contact pads, for example, are formed of a conductive material. The conductive material, for example, may include copper. Other types of conductive material may also be used for the via contacts and contact pads.

As shown, the second die contacts 235 of the bottom die are mounted onto the die region 111*a* of the wiring substrate. The first die contacts 233 are mated with the top die of the die stack. In one embodiment, a die attach film or an underfill 217 can be provided in the cavity formed between the dies to facilitate stacking and to protect bonding contacts 240 which couple the conductive die pads 155 of the second die with the first die contacts 233 of the first die. Redistribution layer may also be provided Similar to FIG. 1, the die and non-die regions of the semiconductor package 200 forms a step 187 in the package substrate. For the case where more than two dies are used to form the die stack, the bottom and intermediate dies may include TSV dies. Providing the bottom and intermediate dies with non-TSV dies may also be useful. The second die contacts of the $n^{th}+1$ die above is connected to the first die contacts of the $n^{th}$ die below.

A cap 190 is provided to encapsulate the die stack 210. In one embodiment, the cap at least surrounds the die stack. For example, the cap at least surrounds and protects the sides of the first $250_1$ and second $250_2$ dies of the die stack. Similar to FIG. 1, the die region is disposed or recessed into the encapsulation material with respect to first major surface 190*a* of the cap 190. In one embodiment, the first surface 190*a* of the cap is about co-planar with the first surface 150*a* of the second die of the die stack. The cap, for example, does not cover the backside or the first surface of the second die of the die stack.

Alternatively, the first surface of the cap need not be co-planar with the first surface of the second die of the die stack. For example, the first surface of the cap is above the backside surface of the second die of the die stack, depending on the thickness of the adhesive layer which is disposed over the backside surface of the second die as will be discussed later. The bottom surface of the cap is disposed on the non-die region of the wiring substrate.

In one embodiment, a carrier 185 which is similar to the carrier as described in FIG. 1 is permanently disposed over the first surfaces of the cap and second die of the die stack. The second surface 185b of the carrier at least contacts the first surface of the cap 190a while the first surface 185a of the carrier is exposed. The second surface of the carrier, for example, covers substantially the whole first surfaces of the second die and the cap. An adhesive 175, similar to the adhesive as described in FIG. 1, is provided on the second surface of the carrier. In one embodiment, the adhesive is provided at least in between the second surface 185b of the carrier and the first surface 150a of the second die. In other embodiments, the adhesive may also be provided in between the second surface of the carrier and the first surfaces of the cap and die. The adhesive, for example, at least permanently bonds the carrier and the die stack.

Figure 3A:
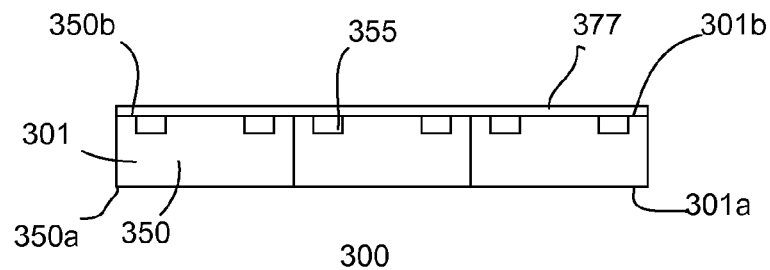
FIGS. 3a-h and FIGS. 4a-c show various embodiments of a method for forming a semiconductor package.

FIGS. 3a-h show an embodiment of a method for forming a semiconductor package 300. FIG. 3a shows a wafer 301 having a first surface 301a and a second surface 301b. The wafer serves as a substrate for forming a die 350. The first surface, for example, is an inactive surface 350a while the second surface is an active surface 350b. Other designations of the surfaces may also be useful. The wafer, for example, may be a silicon wafer. Other types of semiconductor wafers may also be useful. In one embodiment, the wafer is processed to include a plurality of dies or chips. For example, a plurality of dies are processed in parallel on the wafer. Illustratively, the wafer includes three dies being processed in parallel. Providing a wafer with other number of dies or chips may also be useful.

A die 350 includes circuit components formed on the wafer or substrate. The circuit components include, for example, transistors, resistors, capacitors and interconnections to form an IC. A final passivation layer may be formed over the die. The final passivation layer includes openings to expose die pads 355. The surface of the wafer or substrate which includes the openings to the die pads may be referred to as the active surface of the wafer.

In one embodiment, a sacrificial layer 377 is formed over the active surface of the wafer 301b. The sacrificial layer is a temporary layer which will subsequently be removed. The sacrificial layer, for example, is an adhesive material. Other types of sacrificial layer may also be useful. The sacrificial layer may be formed on the substrate using various techniques. For example, the sacrificial layer may be provided by spin coating or lamination. Other techniques for forming the sacrificial layer may also be useful. The technique, for example, may depend on the type of sacrificial layer. In one embodiment, the sacrificial layer may be half-cured to be less tacky during the encapsulation process. In other embodiments, the sacrificial layer remains tacky to improve adhesion to a support carrier, if used.

The process continues by dicing the wafer processed with the dies and sacrificial layer over the active surface of the wafer. Dicing the wafer separates the dies into individual dies with the sacrificial layer over the active surface. In another embodiment, the sacrificial layer 377 may be formed over the active surfaces of the dies after dicing the wafer into individual dies.

Figure 3B:
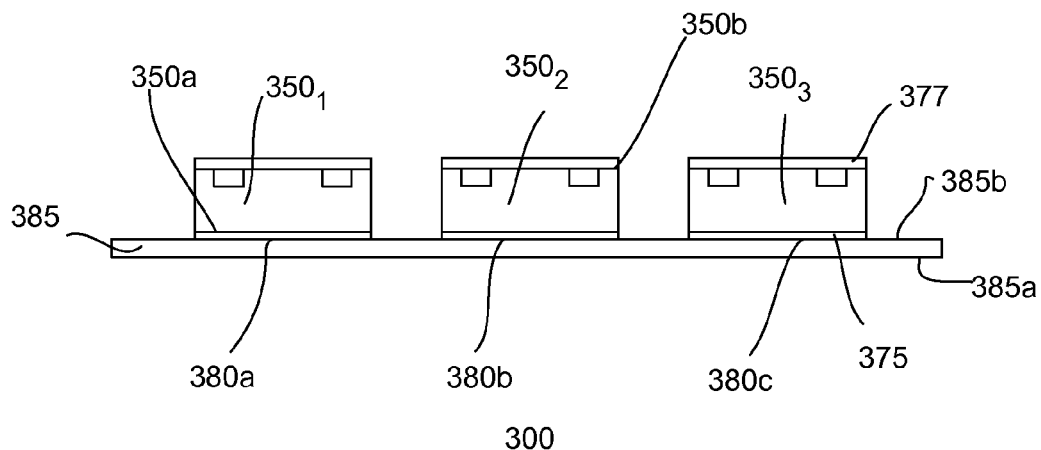

Referring to FIG. 3b, a carrier 385 is provided. In one embodiment, the carrier, for example, is a permanent carrier or permanent support used for processing chip packages. The carrier, in one embodiment, should be sufficiently rigid to serve as a support to permanently hold the dies and withstand further processing steps. For example, the carrier should be sufficiently rigid to reduce or prevent warpage of chip assemblies during the assembly process. Alternatively or in addition, the carrier, for example, may also serve as a thermal conductor for dissipating heat from the die of the semiconductor package. By way of a non-limiting example, the carrier may be a wafer or a conductive plate. For example, the wafer may include a silicon wafer and the conductive plate may include a metal plate. Various other types of materials may be used to form the carrier.

The carrier includes a first surface 385b on which dies are processed to form packages. The carrier can be configured in a strip format to process a row of dies. In other embodiments, the carrier is configured to process a plurality of rows of dies. For example, the carrier may have a panel format to form a 2 dimensional array of packages. Providing a carrier configured in a wafer format to form a plurality of packages may also be useful. In some embodiments, the carrier may be configured to form one package, for example, a single format. The type of format selected may depend on, for example, the requirements of the process, available equipment or cost considerations.

Illustratively, the carrier is configured in a strip format with three package regions or zones 380a-c for forming three packages. Providing a carrier with other number of package regions or formats may also be useful. A package region includes a die region and a non-die region. The size of the package region is equal to about the size of a package. A die 350 coated with the sacrificial layer 377 on the active surface 350b is attached to the die region. For example, three dies $350_{1-3}$ are attached to the die regions on the permanent carrier.

In one embodiment, an adhesive 375 is provided on a first surface 385b of the carrier to facilitate die attachment. Other bonding techniques may also be useful for attaching the dies to the carrier. The adhesive, for example, is provided at least on the die regions on the carrier for permanently holding a chip assembly thereto. In one embodiment, the adhesive is provided only in the die regions. In other embodiments, the adhesive is provided substantially on the whole first surface 385b of the carrier.

In yet other embodiments, the adhesive 375 may be provided over the inactive surface of the wafer. The adhesive, for example, may be applied before or after dicing the wafer into individual dies.

The adhesive can be any type of adhesive that provides permanent bonding of a chip assembly to the chip assembly surface of the carrier. The adhesive 375, for example, may include the same material as the sacrificial layer 377. In other embodiments, the adhesive 375 may include different material than the sacrificial layer. The adhesive may include any suitable thickness so long as it could at least permanently bonds the dies and the carrier during processing. The adhesive may be in different forms. For example, the adhesive may be a film, paste, liquid or thermally conductive adhesive. The adhesive may be provided on the carrier or inactive surface of the wafer or dies using various techniques. The technique employed may depend on the type or form of the adhesive. For example, a tape adhesive may be provided on the carrier by lamination, a paste adhesive may be provided on the carrier by printing while a liquid adhesive may be provided on the carrier by spin-coating. Providing the adhesive on the carrier, inactive surface of the wafer or dies using other techniques may also be useful.

In one embodiment, the inactive surface 350a or backside of the dies are attached to the die regions of the carrier. The dies are attached to the die regions using any suitable techniques according to the equipment and the type of the adhesive used.

Figure 3C:
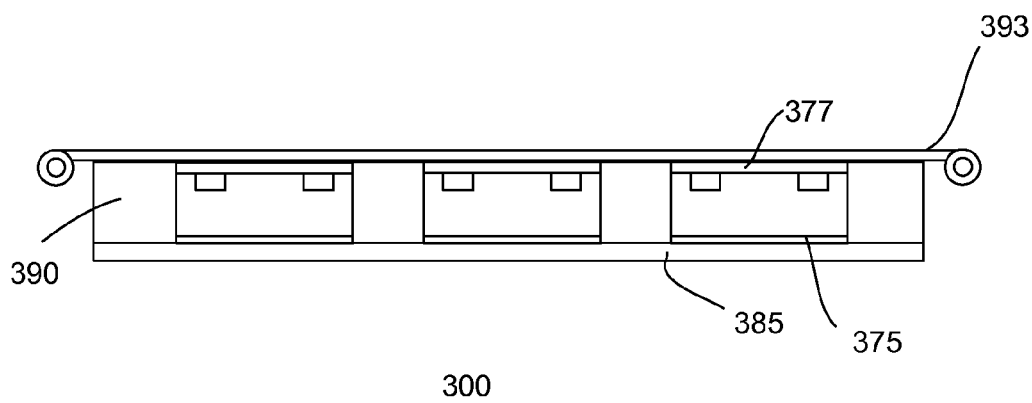

Referring to FIG. 3c, a cap 390 is formed to encapsulate the dies. The cap, in one embodiment, is disposed in the non-die region of the permanent carrier. For example, an encapsulation material is dispensed to fill the spaces between the dies. In one embodiment, the encapsulation is a mold compound, such as molding epoxy resin material. Providing other types of encapsulation materials may also be useful.

The cap, in one embodiment, is formed by transfer molding techniques. In one embodiment, the cap is formed by a film assisted transfer molding technique. For example, a film 393 is placed against contours of a mold (not shown). In one embodiment, when the carrier and the dies are placed against the mold, the film contacts the sacrificial layer on the active surface of the dies, leaving spaces therebetween in the non-die regions. Encapsulation material, such as a mold compound, is dispensed into the mold assembly, filling the spaces in the non-die regions to form the cap. The sacrificial layer protects the active surface of the dies from the encapsulation material. After molding, the molded panel of dies is separated from the mold. The sacrificial layer also facilitates release of the molded panel from the molding tool. Other techniques for forming the cap may also be useful. For example, the cap may also be formed by printing or compression molding.

Removal of the mold leaves the plurality of dies attached to each other by the cap 390 and the carrier 385. The carrier provides additional mechanical support for the chips for further processing. The surfaces of the cap, in one embodiment, are coplanar with the surfaces of the dies. For example, a first surface 390a of the cap is coplanar with the backside or first surface 350a of the dies and a second surface 390b is coplanar with the sacrificial layer 377 on the active or second surface 350b of the dies. Alternatively, the first surface of the cap need not be coplanar with the first surface of the die. For example, the first surface 390a of the cap is disposed in a different plane than the backside surface 350a of the die, depending on the thickness of the adhesive layer 375 which is disposed on the die region on the surface 385b of the carrier. External heat sink or heat spreader (not shown) may also be attached to the backside 385a of the carrier to further improve heat dissipation.

Figure 3D:
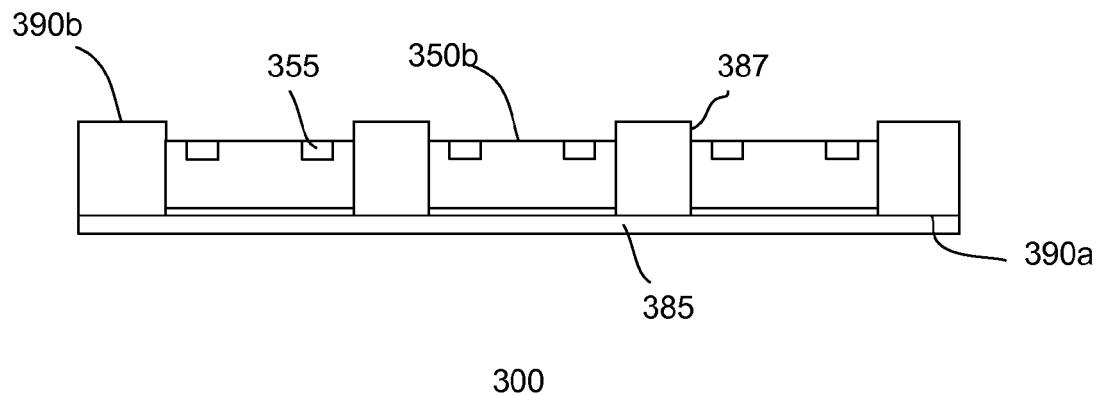
Figure 3E:
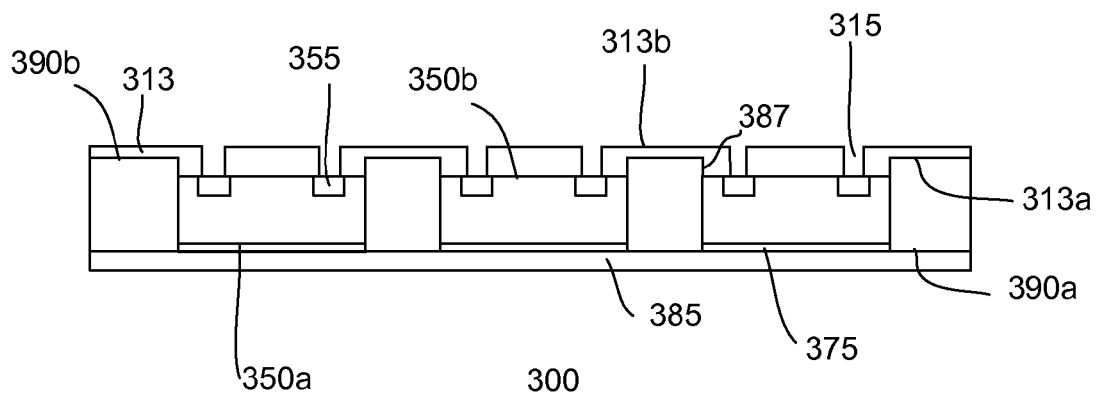

Referring to FIG. 3d, the sacrificial layer 377 is removed. In one embodiment, the sacrificial layer is removed by dissolving the layer with chemicals. For example, chemical which preferably does not cause any damage to the second or active surface of the dies is used to remove the sacrificial layer. Other techniques may also be used to remove the sacrificial layer. The removal of the sacrificial layer exposes the active or second surface of the dies and the die contact pads 355. A cleaning step may optionally be performed to clean the second surface of the die and contact pads. For example, a solvent based cleaning step may be applied. Other suitable cleaning techniques may also be useful.

In one embodiment, the second surface 390b of the cap is non-coplanar with the active surface 350b of the dies. For example, the active surface of the die and the second surface of the cap form a step 387. In one embodiment, the active surface of the dies is recessed below the surface of the cap. The height of the step, for example, may be about the thickness of the sacrificial layer. Other step heights may also be useful.

Providing a step between the active surface of the dies and cap surface alleviates mechanical stress due to the difference between the thermal coefficient of the die and the mold compound in the subsequently formed packages.

The process continues to form a package substrate. The process, for example, continues to form a built-up or integrated wiring substrate. The package substrate, for example, includes a multi-layered substrate. In one embodiment, a first insulating substrate layer 313 is provided on the second surface of the cap and active surface of the dies. For example, a first surface 313a of the first substrate layer contacts the second surface of the cap and fills the recesses over the dies.

In one embodiment, the first substrate layer may be a dielectric layer. The dielectric layer, for example, is disposed on the active surface of the die. Other types of first substrate layer may also be useful. The dielectric materials may be deposited via suitable techniques such as wafer processing technologies, spin coating, printing, etc. Other techniques for depositing the first substrate layer may also be useful.

Vias 315 are formed in the first substrate layer. The vias extend from a second surface 313b through the first surface 313a to expose the die contact pads of the dies. In one embodiment, the vias are formed by laser drilling. Other techniques, such as mechanical drilling or RIE, are also useful. The vias may have tapered or straight profiles, depending on process requirements and type of via formation method used. In one embodiment, the vias are formed with a straight profile. Providing tapering profile (not shown) may also be useful. Particularly, tapering of the sidewalls facilitates filling of the vias. For example, the tapered sidewalls facilitates uniform material coverage of the sidewalls and base of the via which reduces formation of voids.

Figure 3F:
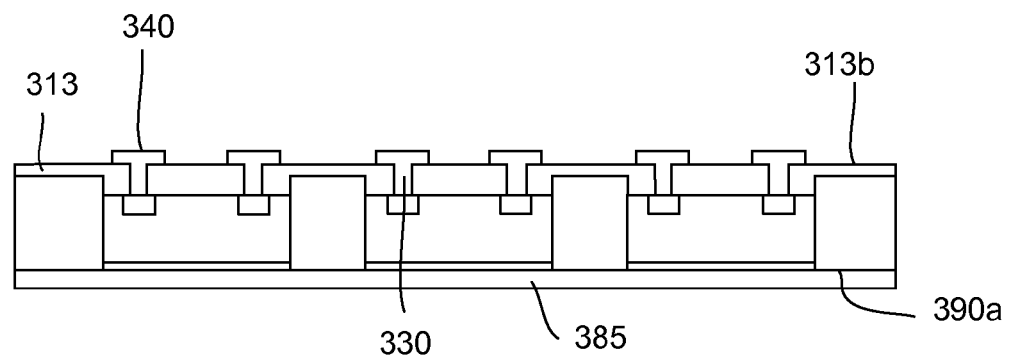

Referring to FIG. 3f, the process continues to form conductive via contacts 330 and traces 340 of the package substrate. In one embodiment, a conductive layer is formed on the first substrate layer, covering the second surface thereof and filling the vias. The conductive layer, for example, may be copper or a copper alloy. Other types of conductive materials may also be useful. For example, other types of conductive materials may include aluminum, gold, nickel or a combination or an alloy thereof. The conductive layer may be formed by plating. For example, electrochemical or electroless plating may be employed to form the conductive layer. Other suitable methods of forming the conductive layer may also be used. In some embodiments, seed layers may be used prior to forming the conductive layer.

The patterning of the conductive layer may be formed with the help of a patterned masked layer prior to the plating process. Alternatively, the conductive layer may be patterned to form conductive traces 340 coupled to the substrate via contacts 330 in the vias which are coupled to the die pads of the same die. The conductive traces and the via contacts form interconnect. Patterning of the conductive layer can be achieved by any suitable etching techniques. For example, a patterned etch mask, such as photoresist, is provided over the conductive layer. An etch may be performed using the etch mask to remove portions of the conductive layer unprotected by the etch mask. The etch, for example, may be an isotropic etch, such as a wet etch. An anisotropic etch, such as reactive ion etch (RIE) may be used. Other techniques for patterning the conductive layer may also be useful.

After patterning the conductive layer, the mask is removed. The mask, for example, may be removed by ashing. Other techniques for removing the mask may also be useful.

Figure 3G:
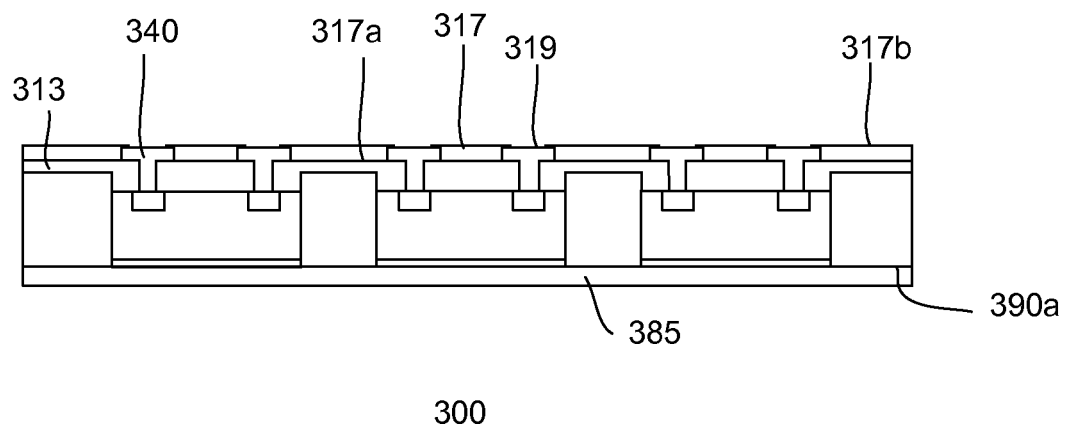

As shown in FIG. 3g, a second insulating substrate layer 317 having a first surface 317a and a second surface 317b is deposited on the first substrate layer, covering and filling the spaces between conductive traces. The second substrate layer provides insulation between conductive traces. A first surface 317a of the second substrate layer contacts the first substrate layer. The second substrate layer serves as a contact mask. In one embodiment, the second substrate is formed of a polymer. The second substrate layer, for example, may be formed by spin-coating. Other types of dielectric materials and deposition techniques may also be useful for forming the second substrate layer.

The second substrate layer is patterned to form contact openings 319 to expose portions of the conductive traces. The contact openings correspond to locations of package contacts of the semiconductor package. For example, the contact openings may be arranged in a grid pattern to form a BGA type package. Other contact opening patterns may also be useful.

Figure 3H:
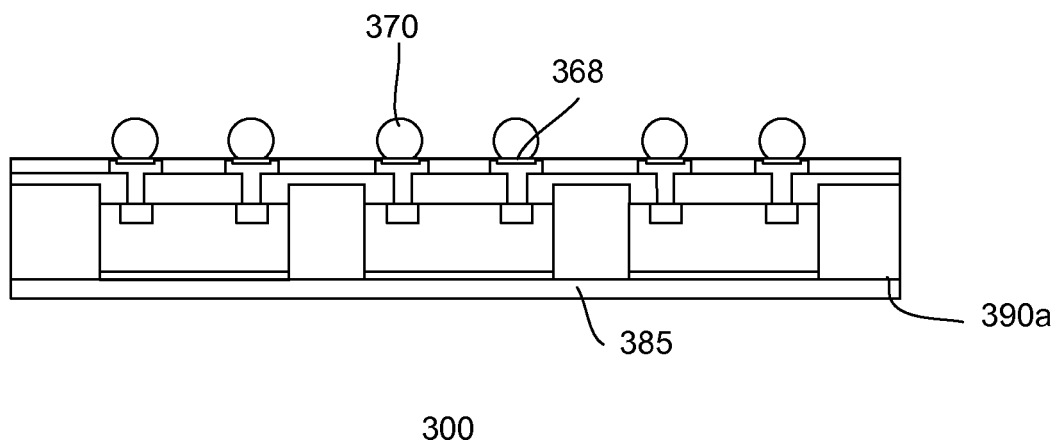

In one embodiment, package or conductive pads 368 are formed on the exposed portions of the conductive traces 340, as shown in FIG. 3h. In one embodiment, the package pads include a conductive material. In one embodiment, the package pads are selectively formed in the openings of the dielectric layer by coating or plating techniques. Other types of conductive materials or techniques may be used to form the contact pads. The conductive pads, for example, are coplanar with the conductive traces. In other embodiments, the conductive pads may include protruding conductive pads. The conductive pads may be further covered with a surface protection material, such as OSP or a metallic coating or plating.

The process continues by forming package contacts 370 in the openings of the package mask, as shown in FIG. 3h. For example, the package contacts are formed on the package pads 368 in the openings of the package mask. The package contacts, for example, may include spherical shaped structures or balls arranged in grid pattern to form a BGA type package. The package contacts are formed of a conductive material. The package contacts, in one embodiment, can be formed from solder. Various types of solder can be used to form the package contacts. For example, the solder can be a lead-based or non lead-based solder.

In some embodiments, other types of package contacts are formed in the openings. For example, the package contacts may include contacts which do not protrude from the bottom surface of the second substrate layer. Providing package contacts which do not protrude from the bottom surface of the second substrate layer, such as solder lands, may also be useful. The package contacts may be formed of materials other than solder or using other techniques.

In yet other embodiments, the package contacts may include copper pillars or gold stud bumps (not shown). The use of copper pillars is advantageous as they do not collapse after reflow. Hence, copper pillars enable semiconductor package with much tighter pitch and more uniform standoff height to be produced. Gold stud bumps, on the other hand, may sometimes be used in conjunction with anisotropic conductive adhesive and thermo-compression welding methods to achieve tight pitches. This is advantageous as it allows IC chips that were originally designed with peripheral bond pads intended for wire bonding to be used as flip chips. Other suitable types of package contacts may also be used.

The process continues to singulate the structure to form individual semiconductor packages. As such, a semiconductor package such as that shown in FIG. 1 is formed.

Figure 4A:
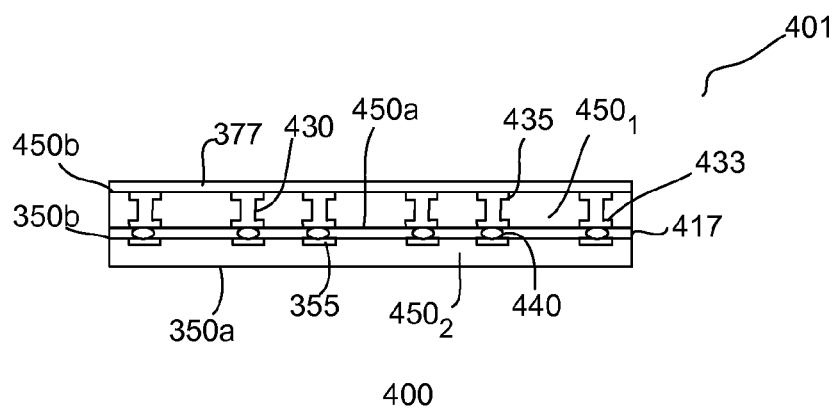
Figure 4B:
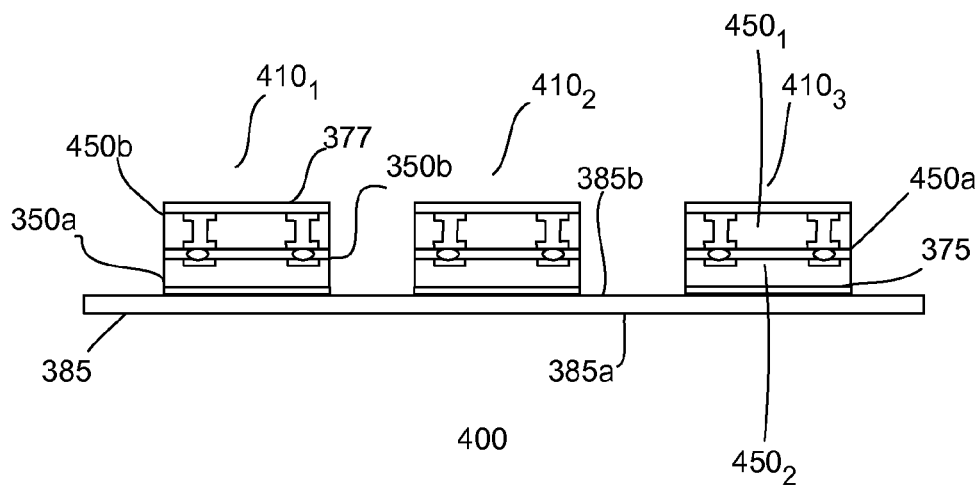
Figure 4C:
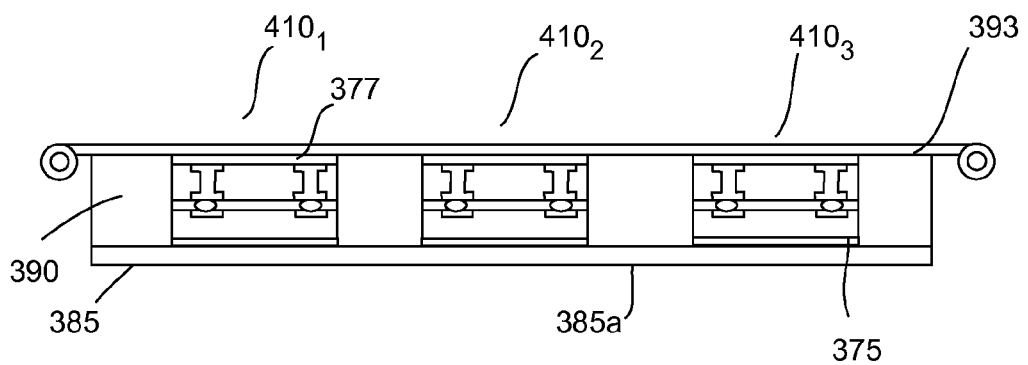

FIGS. 4a-c show another embodiment of a process for forming a semiconductor package 400. The process is similar to that described in FIGS. 3a-h. As such, common elements may not be described or described in detail. Referring to FIG. 4a, a wafer 401 having a die stack arrangement is provided. In one embodiment, the wafer is processed to include a plurality of die stacks 410.

A die stack includes n number of dies, where n is ≥2. The bottom die, for example, may be referred to as the first (e.g., n=1) and the top die is equal to n. Designating the dies of the die stacks using other conventions may also be useful. The die stack, for example, may be formed by any suitable types of die stacking methods. As shown, the die stack includes first and second dies $450_1$ and $450_2$. The second die $450_2$ is attached onto the first die $450_1$, and the first die is attached to the die region of a wiring substrate. Dies used for the die stack may be TSV or non-TSV dies. In one embodiment, both the top and bottom dies may be TSV dies. In yet another embodiment, the bottom die may include a TSV die and top die may include a non-TSV die. Non-TSV die, for example, may include wire bonded, direct connection, flip chip die, etc. For die stacks having more than 2 dies, the lower dies (bottom and intermediate dies except the top die) are usually TSV dies while the top die may be a non-TSV die. Other configurations or types of dies of a die stack may also be useful.

A TSV die includes first and second major surfaces 450a-b. The first surface includes first die contacts 433 and the second major surface includes second die contacts 435. The die contacts, for example, are die contact pads which have top surfaces co-planar with the first and second major surfaces of the TSV die. Providing surfaces of the contact pads which are not co-planar with the surfaces of the die may also be useful. Other configurations of die contacts or die contact pads may also be useful. The first and second die contacts are interconnected by through via contacts 430. Other configurations of TSV dies may also be useful. The via contacts and the contact pads, for example, are formed of a conductive material. The conductive material, for example, may include copper. Other types of conductive material may also be used for the via contacts and contact pads.

As shown in FIG. 4a, the first die contacts 433 are mated with the second die of the die stack. In one embodiment, a die attach film or an underfill 417 can be provided in the cavity formed between the dies to facilitate stacking and to protect bonding contacts 440 which couple the conductive die pads 355 of the second die with the first die contacts 433 of the first die. For the case where more than two dies are used to form the die stack, the bottom and intermediate dies may be TSV dies. Other types of dies may also be used for the bottom and intermediate dies. The second die contacts of the $n^{th}+1$ die above is connected to the first die contacts of the $n^{th}$ die below.

In one embodiment, a sacrificial layer 377 is formed over the second major surface 450b of the first die $450_1$ of the die stack or the wafer 401.

The process continues by dicing the wafer processed with the die stacks and sacrificial layer over the second surface of the wafer. Dicing the wafer separates the die stack into individual die stacks $410_{1-3}$. Although three die stacks are shown in FIG. 4b, it is understood that other number of die stacks may also be provided with the sacrificial layer over the second surface 450b. In another embodiment, the sacrificial layer 377 may be provided after dicing the wafer into individual die stacks.

Referring to FIG. 4b, the process is at a similar stage as that described in FIG. 3b. For example, a carrier 385 having an adhesive 375 on a first surface 385b of the carrier is provided with the die stacks $410_{1-3}$ attached to the die regions on the carrier. In one embodiment, the backsides or first surfaces 350a of the second dies of the die stacks are attached to and contact the die regions having adhesive 375 of the carrier 385. The die stacks are attached to the die regions using any suitable techniques according to the equipment and the type of adhesive used. In one embodiment, the carrier serves as a permanent carrier or permanent support used for processing chip packages. The carrier, in one embodiment, should be sufficiently rigid to serve as a permanent support for holding the die stack during assembly. Alternatively or in addition, the carrier, for example, may also serve as a thermal conductor for dissipating heat from the die stack of the semiconductor package. By way of non-limiting example, the carrier may include a wafer or a conductive plate. For example, the wafer may include a silicon wafer and the conductive plate may include a metal plate. Other suitable types of materials may also be used to form the carrier.

In one embodiment, the adhesive 375 is provided on a first surface of the carrier to facilitate the die stack attachment. Other bonding techniques may also be used for permanently bonding the die stack to the carrier. The adhesive, for example, is provided in at least the die regions on the carrier for permanently holding the chip assembly thereto. In one embodiment, the adhesive is provided on the die regions of the carrier. In other embodiments, the adhesive is provided on the whole first surface of the carrier.

In yet other embodiments, the adhesive 375 may be provided over the first surface of the wafer. The adhesive, for example, may be applied before or after dicing the wafer into individual die stacks. For example, the adhesive may be applied to backsides or first surfaces 350a of the second dies of the die stacks.

The process continues to form a cap 390 as shown in FIG. 4c. In one embodiment, the cap is formed of an encapsulation material, similar to that described in FIG. 3c. In one embodiment, the cap covers the sides of the die stacks as shown in FIG. 4c.

After forming the cap, the process continues, as similarly described in FIG. 3d and onwards. For example, the process continues to form a semiconductor package as described in FIG. 3d and onwards until a semiconductor package as described and as shown in FIG. 2 is produced.

The process, as described with respect to FIGS. 3a-h and FIGS. 4a-c, results in advantages. For example, the sacrificial layer is used to protect the second major surface or active surface of the die or die stack from contamination during molding. Furthermore, the sacrificial layer serves as a temporary coating which is removed after molding such that a recess is created over the second surface of the die or die stack to alleviate mechanical stress arising from the thermal mismatch between the mold compound and the die or die stack. Also, the process allows various molding techniques such as printing, transfer and compression molding to be used to form the cap.

Although only one conductive via and trace level is formed and coupled to the die pads of the same die in the package substrate, it is understood that additional conductive via and trace levels may be included. For example, the first substrate layer may include a plurality of first sub-layers. The process therefore enables multiple wiring structures to be built up in the package substrate as compared to existing wafer based fan-out processes that are limited to only a single metal layer fan-out structures. Furthermore, since the cap serves as a mechanical support for the dies to form package substrate thereon and the resultant structure is in the form of a panel or strip, substrate processes may be used to form the redistribution structures on the active surfaces of the dies. As such, conventional wafer redistribution layers forming processes are not necessarily required. This avoids the need for capital investment in new wafer-based process equipment.

In addition, the carrier as described serves as a permanent carrier or permanent support for holding the die or die stack during assembly. As such, the permanent carrier provides additional support for the die or die stacks during assembly and during formation of the redistribution structures on the active surfaces of the dies. Moreover, the carrier remains as part of the packaged structure. As such, the process for forming a semiconductor package is simplified since the steps of removing the carrier and adhesive from the carrier are eliminated. In addition, depending on the material used for the carrier, the permanent carrier may also serve as a thermal conductor for dissipating heat from the die or die stack of the semiconductor package. The permanent carrier thus enables a semiconductor package with enhanced heat dissipation to be produced.

Furthermore, the permanent adhesive which is used to at least bond the carrier and the dies avoids problems such as resin bleed and also prevents the dies from shifting during the molding process to form the cap. Additionally, the process for forming a semiconductor package is further simplified since no additional process steps are required to remove extra encapsulation material for exposing the first or second surface of the dies for further processing.

The invention may be embodied in other specific forms without departing from the spirit or essential characteristics thereof. The foregoing embodiments, therefore, are to be considered in all respects illustrative rather than limiting the invention described herein.

What is claimed is:

1. A method for forming a semiconductor package comprising:
   providing at least one die having active and inactive surfaces, wherein the active surface of the die includes a plurality of conductive die pads;
   providing a planar permanent carrier having first and second planar surfaces;
   attaching the at least one die to the second planar surface of the planar permanent carrier, wherein the inactive surface of the at least one die is facing the planar permanent carrier which supports the die during assembly; and
   forming a cap having first and second surfaces to encapsulate the at least one die, wherein
   the cap surrounds the at least one die without contacting the active surface of the at least one die,
   the second planar surface of the planar permanent carrier covers the inactive surface of the at least one die and the first surface of the cap, and
   the second surface of the cap is disposed at a different plane than the active surface of the die.

2. The method of claim 1 comprising providing an adhesive on the second planar surface of the planar permanent carrier.

3. The method of claim 2 wherein the adhesive is provided at least on a die region on the second planar surface of the planar permanent carrier for permanently holding the at least one die to the permanent carrier.

4. The method of claim 1 wherein the planar permanent carrier comprises a wafer.

5. The method of claim 2 wherein the adhesive comprises a film, paste, liquid or thermally conductive adhesive.

6. The method of claim 2 wherein the first surface of the cap is coplanar with a top surface of the adhesive.

7. The method of claim 1 wherein attaching the at least one die to the planar permanent carrier is performed prior to forming the cap.

8. The method of claim 1 comprising forming a sacrificial layer on the entire active surface of the at least one die.

9. The method of claim 8 comprising removing the sacrificial layer from the active surface of the at least on die after forming the cap.

10. The method of claim 1 wherein the cap is formed by a molding technique comprising transfer molding or compression molding.

11. The method of claim 1 comprising:
forming a built-up package substrate which comprises at least a first patterned substrate layer having first and second surfaces, wherein the first surface of the patterned substrate layer comprises a die region and a non-die region, the die and non-die regions are defined by the first surface of the same first patterned substrate layer, wherein the die region is disposed in a different plane than the non-die region, and wherein the first patterned substrate layer comprises
vias disposed therein,
interconnect structures having substrate via contacts disposed in the vias and conductive traces disposed over the second surface of the first patterned substrate layer, wherein at least one of the conductive traces which is coupled to the conductive pad extends from the die region to the non-die region, and
wherein the active surface of the at least one die directly contacts the first surface of the first patterned substrate layer at the die region and the plurality of conductive pads of the die are directly coupled to and contact the substrate via contacts.

12. A method for forming a semiconductor package comprising:
providing a wafer having a plurality of die stacks having active and inactive surfaces, wherein the active surface of the die stack includes a plurality of conductive die pads;
singulating the wafer into individual die stacks;
providing a planar permanent carrier having first and second planar surfaces;
attaching the die stacks to the second planar surface of the planar permanent carrier, wherein the inactive surface of the at least one die stack is facing the planar permanent carrier which supports the die stacks during assembly; and
forming a cap having first and second surfaces to encapsulate the die stacks, wherein
the cap surrounds the die stacks without contacting the active surface of the die stacks,
the second planar surface of the planar permanent carrier covers the inactive surface of the die stacks and the first surface of the cap, and
the second surface of the cap is disposed at a different plane than the active surface of the die stack.

13. The method of claim 12 comprising providing an adhesive on the second planar surface of the planar permanent carrier.

14. The method of claim 13 wherein the adhesive is provided at least on a die region on the second planar surface of the planar permanent carrier for permanently holding the die stacks to the carrier.

15. The method of claim 12 comprising providing an adhesive on the inactive surface of the die stacks.

16. The method of claim 12 wherein the adhesive comprises a film, paste, liquid or thermally conductive adhesive.

17. The method of claim 12 wherein the permanent carrier includes a wafer.

18. The method of claim 12 wherein attaching the die stacks to the planar permanent carrier is performed prior to forming the cap.

19. The method of claim 12 comprising forming a sacrificial layer on the entire active surface of the die stacks.

20. The method of claim 12 comprising:
forming a built-up package substrate which comprises at least a first patterned substrate layer having first and second surfaces, wherein the first surface of the patterned substrate layer comprises a die region and a non-die region, the die and non-die regions are defined by the first surface of the same first patterned substrate layer, wherein the die region is disposed in a different plane than the non-die region, and wherein the first patterned substrate layer comprises
vias disposed therein,
interconnect structures having substrate via contacts disposed in the vias and conductive traces disposed over the second surface of the first patterned substrate layer, and
wherein the active surface of the die stack directly contacts the first surface of the first patterned substrate layer at the die region and the plurality of conductive pads are directly coupled to and contact the substrate via contacts.

\* \* \* \* \*